(12) United States Patent
Tellkamp et al.

(10) Patent No.: US 7,550,852 B2
(45) Date of Patent: Jun. 23, 2009

(54) COMPOSITE METAL COLUMN FOR MOUNTING SEMICONDUCTOR DEVICE

(75) Inventors: John P Tellkamp, Denison, TX (US); Akira Matsunami, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/470,541

(22) Filed: Sep. 6, 2006

(65) Prior Publication Data

US 2007/0018304 A1    Jan. 25, 2007

Related U.S. Application Data

(62) Division of application No. 10/732,666, filed on Dec. 8, 2003, now Pat. No. 7,125,789.

(60) Provisional application No. 60/437,593, filed on Dec. 31, 2002.

(51) Int. Cl.
*H01L 23/48* (2006.01)
(52) U.S. Cl. .................. 257/772; 257/587; 257/778
(58) Field of Classification Search ................ 257/772, 257/689, 778
See application file for complete search history.

(56) References Cited

U.S. PATENT DOCUMENTS 5,130,779 A    7/1992  Agarwala et al.
5,468,995 A *  11/1995  Higgins, III ................. 257/697
6,024,275 A    2/2000  Takiar
6,077,380 A    6/2000  Hayes et al.
6,249,963 B1   6/2001  Chou et al.
6,337,445 B1 * 1/2002  Abbott et al. ................ 174/260
6,730,856 B2 * 5/2004  Furukuwa .................... 174/256
2003/0038162 A1  2/2003  Chew et al.
2004/0087057 A1  5/2004  Wang et al.

FOREIGN PATENT DOCUMENTS

EP          0704895 A2    4/1996
WO          WO9719466     5/1997

* cited by examiner

*Primary Examiner*—W. David Coleman
*Assistant Examiner*—Colleen E Rodgers
(74) *Attorney, Agent, or Firm*—Yingsheng Tung; Wade J Brady, III; Frederick J Telecky, Jr.

(57) ABSTRACT

An integrated circuit chip which has a plurality of pads and non-reflowable contact members to be connected by reflow attachment to external parts. Each of these contact members has a height-to-diameter ratio and uniform diameter favorable for absorbing strain under thermo-mechanical stress. The members have a solderable surface on each end and a layer of reflowable material on each end. Each member is solder-attached at one end to a chip contact pad, while the other end of each member is operable for reflow attachment to external parts.

13 Claims, 5 Drawing Sheets

US 7,550,852 B2

COMPOSITE METAL COLUMN FOR MOUNTING SEMICONDUCTOR DEVICE

This application is a divisional of application serial number 10/732,666 filed Dec. 8, 2003 which claims priority of provisional application Ser. No. 60/437,593 filed Dec. 31, 2002, the contents of which are herein incorporated by reference in its entirety.

FIELD OF THE INVENTION

The present invention is related in general to the field of semiconductor devices and processes and more specifically to the structure and method of interconnection members of integrated circuit chips and packages.

DESCRIPTION OF THE RELATED ART

During and after assembly of the integrated circuit (IC) chip to an external part such as a substrate or circuit board by solder reflow, and then during device operation, significant temperature differences and temperature cycles appear between semiconductor chip and the substrate. The reliability of the solder joint is strongly influenced by the coefficients of thermal expansion of the semiconductor material and the substrate material. For example, there is more than one order of magnitude difference between the coefficients of thermal expansion of silicon and FR-4. This difference causes thermomechanical stresses, which the solder joints have to absorb.

Thermomechanical stress difficulties are aggravated by coplanarity problems of the solder balls and the difficulties to obtain the most favorable height-to-diameter ratio and uniformity of the solder interconnection. These difficulties already start with the solder ball attach process. As an example, when solder paste is dispensed by machines, the volume of solder paste may vary in volume, making it difficult to control the solder ball height. When prefabricated solder balls are used, the difficulty of avoiding a missed attachment site is well known.

An urgent need has therefore arisen for a coherent, low-cost method to fabricate solder balls of uniform volume and deliver them to the attachment site without missing a site. The method should be flexible enough to be applied for different semiconductor product families and a wide spectrum of design and process variations.

Furthermore, detailed calculations in the literature, involving the optimum height and volume of the solder connection and the expected onset of fatigue and cracking, showed that solder connections of short length and non-uniform width are unfavorable for stress distribution and strain absorption. The stress remains concentrated in the region of the chip-side solder joint, where it may leads to early material fatigue and crack phenomena. Solder connections of generally spherical shape are more sensitive to stress than elongated connections.

The fabrication methods and reliability problems involving flip-chips re-appear, in somewhat modified form, for ball-grid array type packages and chip-scale packages (CSP). Most CSP approaches are based on flip-chip assembly with solder bumps or solder balls on the exterior of the package, to interface with system or wiring boards.

Following the solder reflow step, flip-assembled chips and packages often use a polymeric underfill between the chip, or package, and the interposer, substrate, or PCB. These underfill materials alleviate some of the thermomechanical stress caused by the mismatch of the coefficients of thermal expansion (CTE). But as a process step, underfilling is time-consuming and expensive, and is thus not welcome.

During the last decade, a number of variations in device structure, materials, or process steps have been implemented in manufacturing, in order to alleviate the thermomechanical stress problem. All of them suffer from some drawback in cost, or fabrication flow, or material selection.

An urgent need has therefore arisen for a coherent, low-cost method of fabricating flip-chip assembly of integrated circuit chips and semiconductor devices, which offers a fundamental structural and metallurgical solution of thermomechanical stress reliability. The method should be flexible enough to be applied for different semiconductor product families and a wide spectrum of design and process variations. Preferably, these innovations should be accomplished using the installed equipment base so that no investment in new manufacturing machines is needed.

SUMMARY OF THE INVENTION

The first embodiment of the invention comprises a method for forming solder contact balls of uniform volume and assembling these balls on the integrated circuit (IC) contact pads of a semiconductor wafer, without missing a contact pad. A sheet of solder material is provided; the thickness of the sheet determines one dimension of the volume of the solder balls.

Further provided is a two-part die for guiding a stamping tool; each part has a structure to match the pattern of the IC pads. The solder sheet is clamped between the die parts. A stamping tool has a plurality of stamping pins; the cross section area of the pins determines the other dimensions of the solder ball volume. The pins are distributed to match the distribution of the circuit pads. The stamping tool, the die with the clamped solder sheet, and the semiconductor wafer are aligned so that each stamp pin is located over one of the circuit pads. The tool is pressed through the die and the sheet so that each pin stamps out a platelet from the sheet, creating one platelet for each pad area. The platelets are brought in surface contact with the pads. Heat is then applied to the individual solder platelets and the wafer to melt the platelets. Finally, the melted solder reflows to form a solder ball at each contact pad area.

It is a technical advantage of the method of the invention that all solder balls for an IC wafer are created in a batch process, have the same volume, and no contact pads can be missed. The method is low-cost and reliable.

In the second embodiment of the invention, the method is applied to batch-process forming of the solder balls and assembling the balls on the contact pads of a semiconductor package. It is a technical advantage of the invention that the method can be applied to many families of surface-mount packages such as ball grid array packages, chip-scale packages, and chip-size packages.

The third embodiment of the invention comprises an integrated circuit chip, which has a plurality of pads and non-reflowable contact members to be connected by reflow attachment to external parts. Each of these contact members has a height-to-diameter ratio and uniform diameter favorable for absorbing strain under thermo-mechanical stress. The members have a solderable surface on each end and a layer of reflowable material on each end. Each member is solder-attached at one end to a chip contact pad, while the other end of each member is operable for reflow attachment to external parts.

The height-to-diameter ratio is preferably $>/=1$ and the diameter of the member stays constant over the whole height of the member. Preferably, the members are made of a low modulus material; preferred choices include aluminum, copper, nickel, and alloys thereof. The end surfaces of the members may have an adherent layer of solderable metal, including copper, nickel, gold, palladium, and alloys thereof. The layer of reflowable material at each member end preferably includes tin and tin alloys. It is an advantage for many device applications, to select the reflowable material layer so that the material at the member end facing the chip has a higher reflow temperature than the material at the member end intended for attachment to external parts.

The fourth embodiment of the invention comprises a semiconductor package, such as a ball grid array or a chip-scale package, which has a plurality of pads and non-reflowable contact members to be connected by reflow attachment to external parts. Each of these contact members has a height-to-diameter ratio and uniform diameter favorable for absorbing strain under thermo-mechanical stress. The members have a solderable surface on each end and a layer of reflowable material on each end. Each member is solder-attached at one end to a package contact pad, while the other end of each member is operable for reflow attachment to external parts.

The process flow for fabricating non-reflowable contact members and assembling these members on the integrated circuit pads of semiconductor wafers, or package pads of semiconductor devices, starts with providing a metal sheet, which has a center layer of non-reflowable metal and a layer of reflowable material on each surface. The thickness of the sheet is selected so that it will determine the height of the member-to-be-fabricated.

Further provided is a two-part die for guiding a stamping tool, each part having a structure to match the pattern of the IC pads, or package pads. The multi-layer sheet is clamped between the die parts. The stamping tool has a plurality of stamping pins with a diameter, which determines the diameter of the members-to-be-fabricated. The distribution of the pins matches the distribution of the contact pads.

The stamping tool, the die with the clamped sheet, and the semiconductor wafer (or package, respectively) are aligned so that each stamp pin is located over one of the contact pads. Pressing the tool through the die and the sheet stamps out a member of the sheet and creates one member for each pad area. After the members and the pads are brought into contact, heat is applied until the reflowable material between the members and the pads is melting. When the temperature is lowered again below the reflow temperature, each member becomes firmly attached to its respective contact pad.

It is a technical advantage of the method of the invention that the height-to-diameter ratio of the connection members is controlled by the choice of the metal sheet thickness and the stamping tool pin diameter. All members have uniform dimensions. The tolerance of thermomechanical stress can thus be maximized.

Another advantage of the invention is the wide range of material variation available for the choice of the connection members, enabled by the selection of the non-reflowable metal sheet, its wettable surfaces, and its reflowable material layers.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1 is the perspective view of a sheet of solder material.

FIG. 2 is a schematic cross section of a plurality of separate parts for assembly according to the invention, comprising solder sheet, stamping tool, two-part die, and wafer (or package, or substrate).

FIG. 3 is a schematic cross section of the same parts as in FIG. 2, with the solder sheet clamped between the two parts of the die.

FIG. 4 is a schematic cross section of the same parts as in FIG. 2, with the solder platelets punched form the sheet by the stamping tool.

FIG. 5 is a schematic cross section of a portion of the wafer (or package, or substrate) after the solder platelets have been stamped from the sheet and attached to the contact pads.

FIG. 6 is a schematic cross section of the same portion of the wafer (or package, or substrate) as in FIG. 5, after reflow of the solder platelets.

FIGS. 8 to 12 refer to the third and fourth embodiments of the invention.

FIG. 9 is a schematic cross section of a plurality of separate parts for assembly according to the invention, comprising composite sheet, stamping tool, two-part die, and wafer (or package, or substrate).

FIG. 10 is a schematic cross section of the same parts as in FIG. 9, with the composite sheet clamped between the two parts of the die.

FIG. 11 is a schematic cross section of the same parts as in FIG. 9, with the composite columns punched from the sheet by the stamping tool.

FIG. 12 is a schematic cross section of a portion of the wafer (or package, or substrate) after the composite columns have been stamped from the sheet and attached to the contact pads.

DETAILED DESCRIPTION OF THE PREFERRED EMBODIMENTS

The schematic FIGS. 1 to 6 describe the process steps for the first and second embodiments of the invention, comprising the fabrication of solder contact balls of uniform volume and the assembly of these solder contact balls on the integrated circuit (IC) contact pads of a semiconductor wafer, or respectively, their assembly on the contact pads of a semiconductor package or a substrate such as a printed circuit board. As defined herein, the term contact ball does not imply that the solder contacts are necessarily spherical. They may have various forms, such as semispherical or half-dome. Based on the method of the invention, all contact balls have the same volume and the same height.

Figure 1:
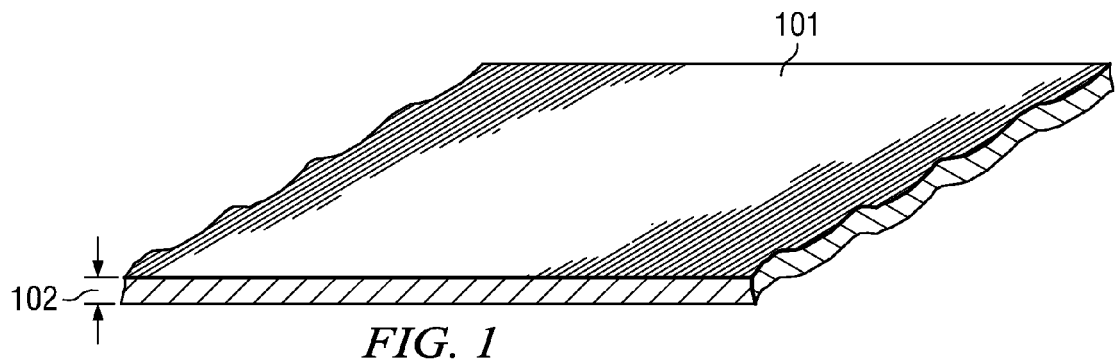
FIGS. 1 to 6 refer to the first and second embodiments of the invention.

The process flow starts with a sheet or ribbon of solder material 101, as depicted in FIG. 1. The solder material is selected from a group consisting of tin, tin alloys including tin/copper, tin/indium, tin/silver, tin/bismuth, tin/lead, indium, and conductive adhesive compounds. The sheet or ribbon 101 has uniform thickness 102. Thickness 102 determines one dimension of the volume of the solder balls-to-be-fabricated.

Figure 2:
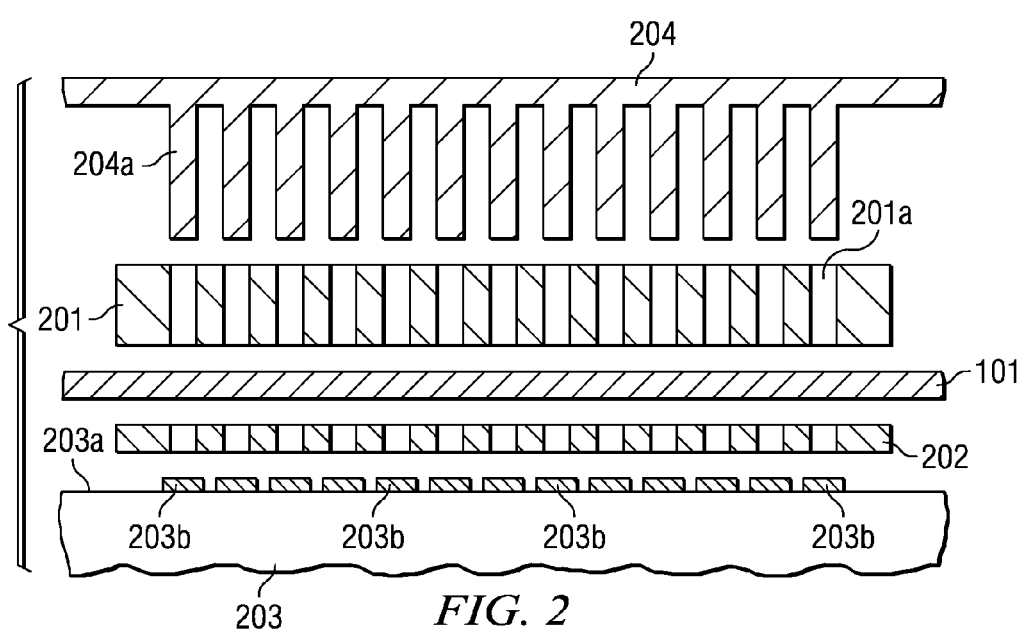

Solder sheet 101 is positioned between a die, as shown in the schematic cross section of FIG. 2. The die has first part 201 with a plurality of openings 201a designed to match the stamping tool and operate as guides to the pins of the stamping tool. The second part of the die is designated 202; it faces the surface 203a of the wafer (or package, or substrate) 203. On the surface 302a of wafer (or package, or substrate) 203 are the plurality of the contact pads 203b, which have been prepared to accept the balls-to-be-formed. The preparation includes a solderable contact surface.

Also shown in FIG. 2 is the schematic cross section of the stamping tool 204 with the plurality of stamping pins 204a. The pattern of pins 204a is matched by the openings 201a of the die and the contact pads 203b of the wafer (or package, or substrate) 203. The cross section area of these pins contains the other two dimensions effective for determining the solder ball volume. The stamping pins may generally be called cylinders, and the cross section of these cylinders may be selected from a group consisting of round, elliptical, square, rectangular, and any other suitable configuration.

Figure 3:
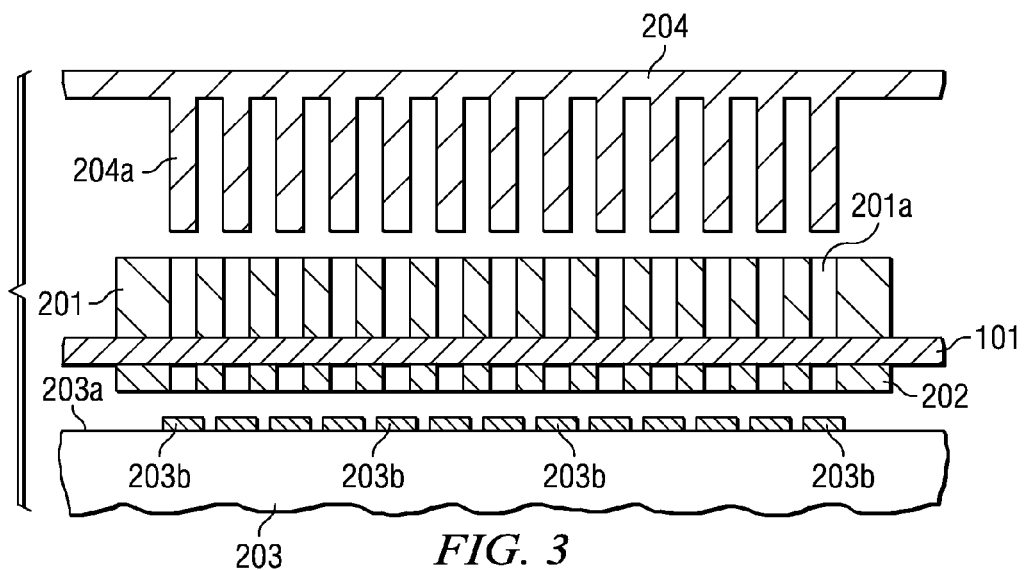

FIG. 3 illustrates the process step of clamping the solder sheet 101 between first die part 201 and second die part 202. Further shown in FIG. 3 is the process step of aligning the stamping tool 204, the die parts 201 and 202 with the clamped sheet 101 in between the parts, and the wafer (or package, or substrate) 203 so that each stamp pin 204a is located over one of the contact pads 203b.

Figure 4:
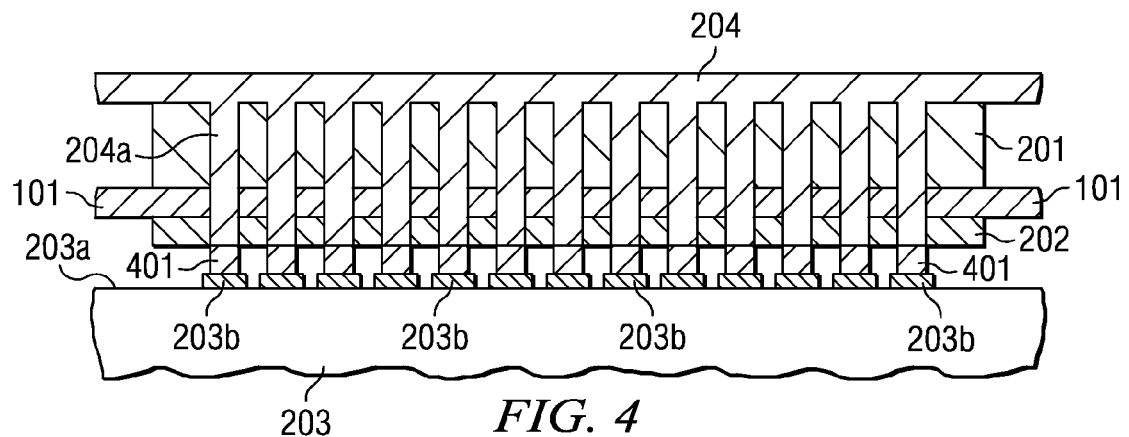

In the next process step, as depicted in FIG. 4, the stamping tool 204 is pressed through the die parts 201 and 202, and through solder sheet 101 so that each stamping pin 204a punches a platelet 401 from sheet 101. In this process step, one platelet 401 is created for each contact pad area 203b on wafer (or package, or substrate) 203. No contact pads 203b are left without a solder platelet 401.

Figure 5:
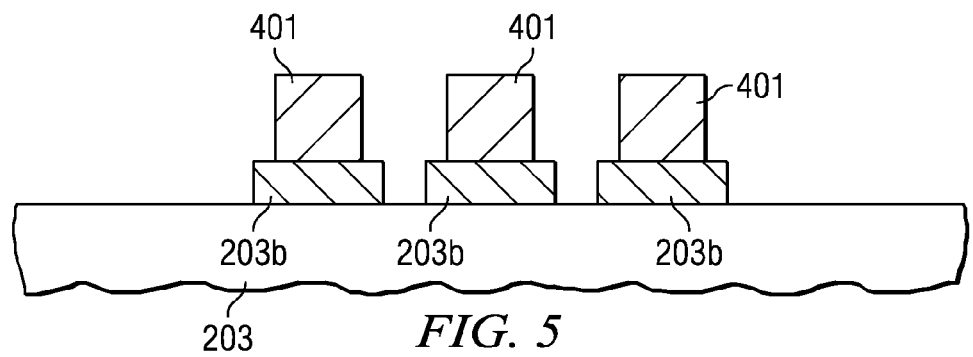

In a magnified cross sectional view, FIG. 5 illustrates a small number of these platelets 401 after they have been brought in surface contact with contact pads 203b. As can be seen, the stamping method creates solder platelets of equal size and volume. The height is determined by the thickness 102 of the solder sheet 101, and the area is determined by the cross section of stamp cylinders 204a, which, in turn, has been selected to be equal to the area of contact pads 203b.

Figure 6:
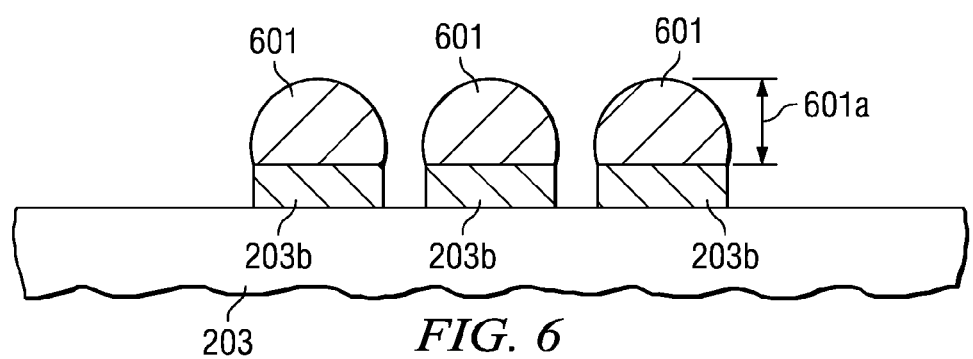

Solder flux may be applied to the contact pads 203b prior to aligning the die and solder sheet with the wafer (or package, or substrate). Consequently, after applying heat to the individual solder platelets and the wafer (or package, or substrate), the platelet will melt and wet the whole area of contact pad 203b. This reflow process step is shown in FIG. 6, where surface tension has formed "balls" 601 (more precisely "half-domes") out of the melted solder. All balls 601 have the same solder volume and the same height 601a, since they completely cover the (equal) area of contacts 203b.

The method of the invention allows the fabrication of the solder balls over a wide range of sizes. When body 203 is a silicon wafer and the pads 203b are the contact pads of an IC, typical solder "ball" heights are between 0.1 to 0.3 mm. The assembly is by flip-chip surface mount. When body 203 is a semiconductor package, or a substrate, and the pads 203b are package contact pads, or substrate contact pads, typical solder "ball" heights are 0.5 mm and considerably larger. The semiconductor packages include ball grid array packages, chip-scale packages, chip-size packages, or any packages assembled to outside parts by means of surface mount and reflow materials.

Figure 7:
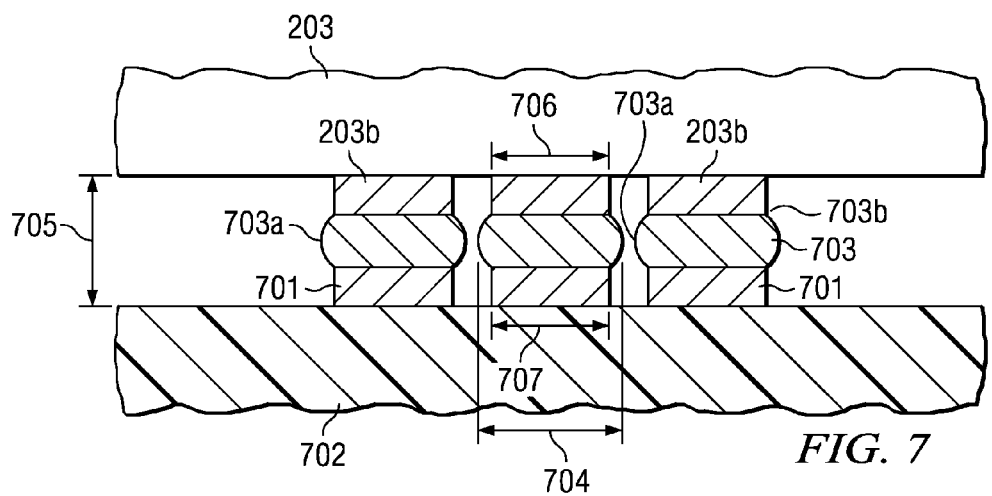
FIG. 7 is a schematic cross section of the solder joints after reflow attachment of the wafer (or package, or substrate) onto an external part.

The schematic cross section of FIG. 7 describes the typical result of surface mount assembly of a chip or package 203 onto the contact pads 701 of a substrate 702. The solder "balls" 601 are reflowed a second time; under pressure, they deform into the bulgy shape of the interconnections 703, characterized by the protruding center regions 703a and the comparatively narrower solder joints 703b.

Figure 8A:
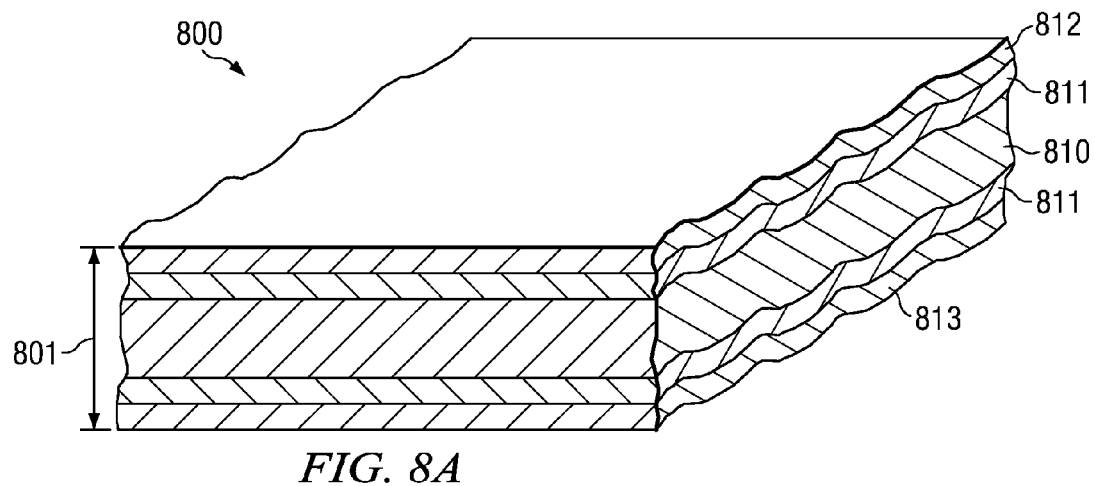
FIG. 8A is the perspective view of a composite sheet of attachment material according to the invention.

The schematic FIGS. 8A/8B to 12 describe the process steps for the third and fourth embodiments of the invention, comprising the fabrication of non-reflowable contact members and the assembly of these members on the IC contact pads of a semiconductor wafer, or respectively, their assembly on the contact pads of a semiconductor package or a substrate such as a printed circuit board.

The process flow starts with the layered sheet or ribbon generally designated 800 in FIG. 8A. The sheet has uniform thickness 801. Thickness 801 determines the height of the members-to-be-fabricated.

Figure 8B:
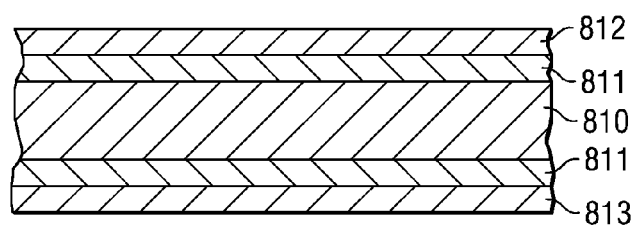
FIG. 8B is a schematic cross section through the composite sheet of attachment material according to the invention.

The cross section of FIG. 8B describes the layered structure of sheet 800. The composition and fabrication of sheet 800 insures low cost. The relatively thick center layer 810 is made of non-reflowable metal, preferably of low modulus material, selected from a group consisting of aluminum, copper, nickel, titanium, tantalum, tungsten, tin, lead and alloys thereof (tin and lead are only used in the temperature range below their reflow temperature). A preferred low cost choice is aluminum. When the metal of layer 810 is not solderable, an additional adherent layer 811 of reflowable material is on both sides of the center layer 810. The additional metal is selected from a group consisting of copper, nickel gold, silver, palladium, and alloys thereof. Compared to the thick center layer 810, the solderable layer 811 may be thin or just a flash.

The outermost surfaces of sheet 800 are adherent layers of reflowable material. The reflowable materials are selected from a group consisting of tin, tin alloys including tin/copper, tin/indium, tin/silder, tin/bismuth, tin/lead, indium, and conductive adhesive compounds. In the preferred embodiment, the reflowable layer 812, which will be used to interconnect with the chip, has a higher reflow temperature than the reflowable layer 813, which will be used to attach the device to an external part.

Figure 9:
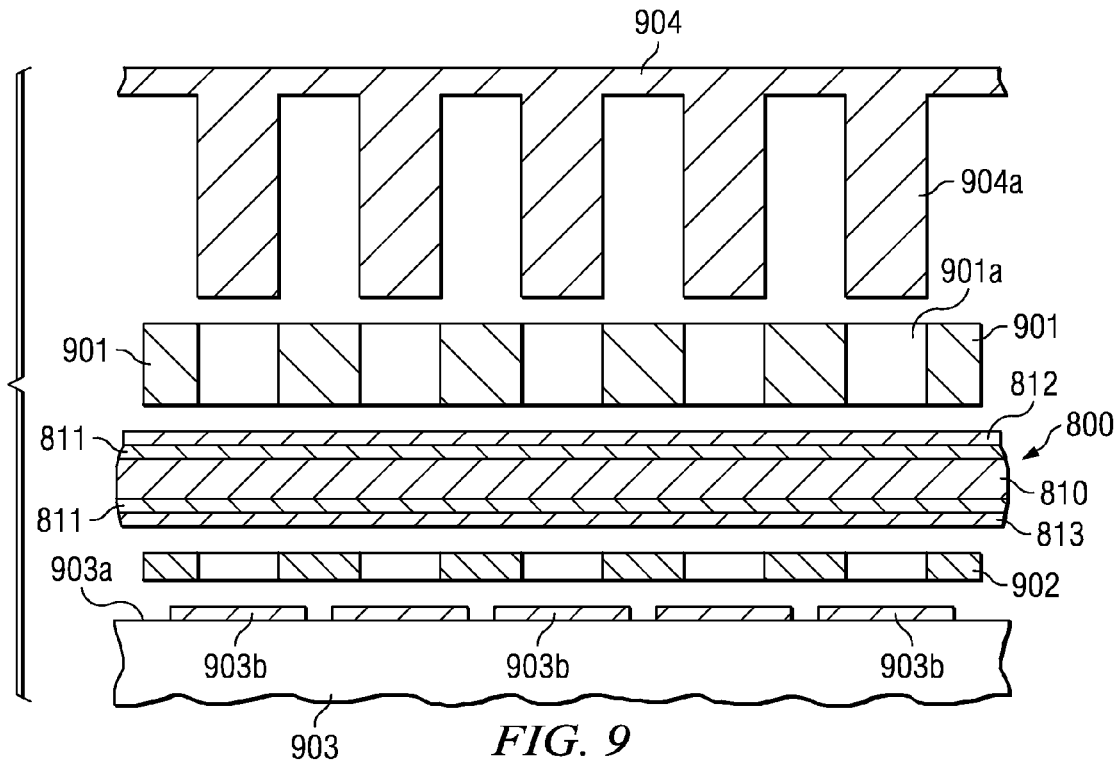

As shown in FIG. 9, sheet 800 is positioned between a die having a first part 901 with a plurality of openings 901a designed to match the stamping tool and operate as guides to the pins of the stamping tool. The second part of the die is designated 902; it faces the surface 903a of the wafer (or package, or substrate) 903. On the surface 903a of wafer (or package, or substrate) 903 are the plurality of contact pads 903b, which are made of solderable metal and have been prepared to accept the connection member-to-be-formed. Other than solderability, the preparation may include the deposition of flux.

Also shown in FIG. 9 is the schematic cross section of the stamping tool 904 with the plurality of stamping pins 904a. The pattern of pins 904a is matched by the openings 901a of the die and the contact pads 903b of the wafer (or package, or substrate) 903. The diameter of these pins determines the diameter of the members-to-be-fabricated. The stamping pins may generally be called cylinders, and the cross section of these cylinders may be selected from a group consisting of round, elliptical, square, rectangular, and any other suitable configuration.

Figure 10:
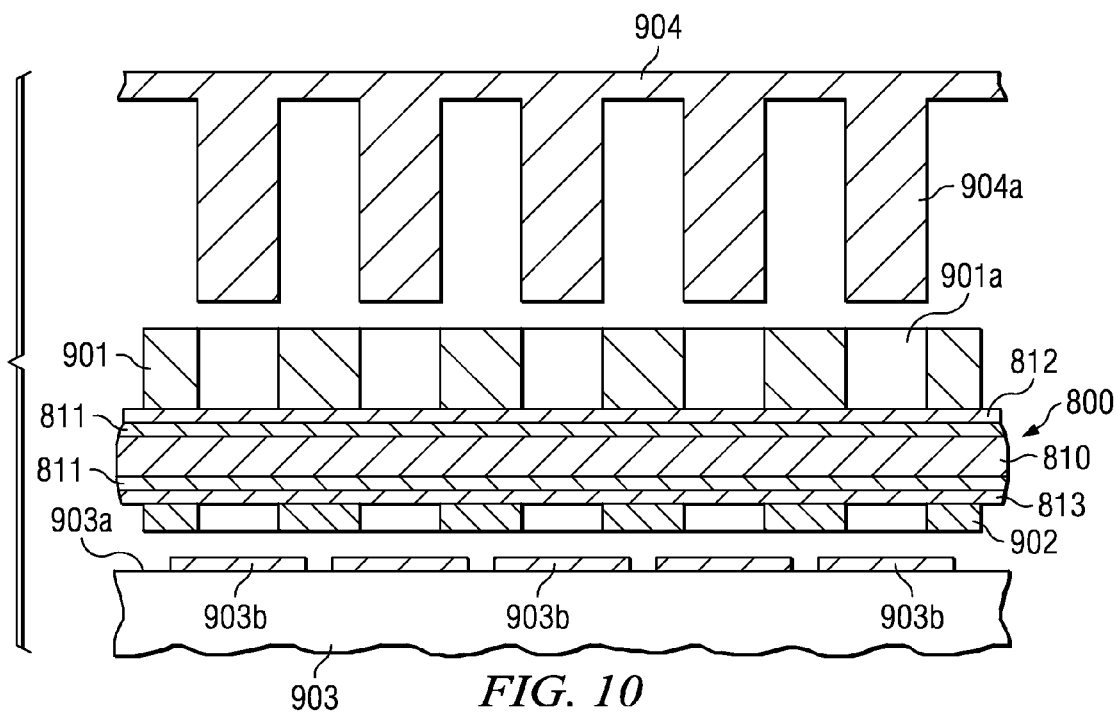

FIG. 10 illustrates the process step of clamping the sheet 800 between first die part 901 and second die part 902. Further shown in FIG. 10 is the process step of aligning the stamping tool 204, the die parts 901 and 902 with the clamped sheet 800 in between the parts, and the wafer (or package, or substrate) 903 so that each stamp pin 904a is located over one of the contact pads 903b.

Figure 11:
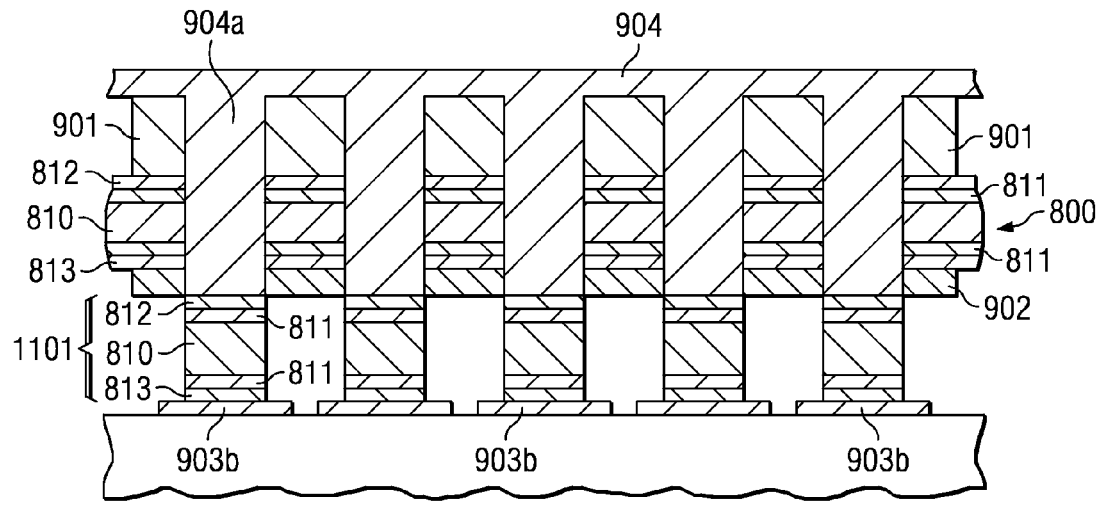

In the next process step, as depicted in FIG. 11, the stamping tool 904 is pressed through the die parts 901 and 902, and through sheet 800 so that each stamping pin 904a punches a member 1101 from sheet 800. In this process step, one member 1101 is created for each contact pad area 903b on wafer (or package, or substrate) 903. No contact pads 903b are left without a connection member 1101.

Figure 12:
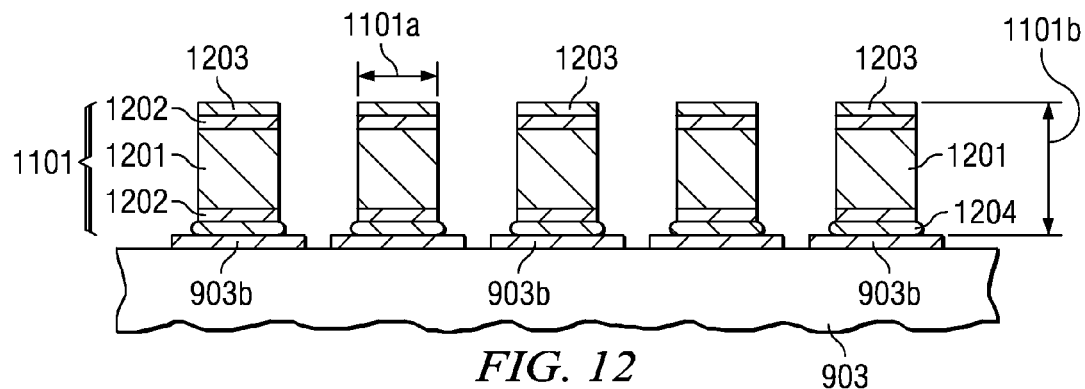

In a magnified cross sectional view, FIG. 12 illustrates a small number of these connection members 1101 after they have been brought in surface contact with contact pads 903b. As can be seen, the stamping method creates members of equal diameter 1101a and height 1101b, each member having uniform diameter over the complete height. For absorbing strain under thermomechanical stress, the preferred height-to-diameter ratio is >/=1. The height 1101b is determined by the thickness 801 of the sheet 800, and the diameter 1101a is determined by the diameter of stamp cylinders 904a. The dominant portion of members 1101 is the center portion 1201 made of the non-reflowable material (for example, aluminum or copper) of the sheet center layer 810. The solderable surface on each end of the member may have to be created by an adherent layer 1202 of solderable metal (for example copper or gold), if the non-reflowable metal 1201 is not solderable by nature. Layers 1203 and 1204 are made of reflowable material. Preferably, the material selected for layer 1204 has a higher reflow temperature than the material selected for layer 1203. In FIG. 12, layers 1204 have already reflowed in order to attach members 1101 to contact pads 903b of wafer (or package or substrate) 903. In contrast, layers 1203 have not reflowed yet and are still operable for reflow attachment to external parts.

Solder flux may be applied to the contact pads 903b prior to aligning the die and sheet with the wafer (or package, or substrate). Consequently, after applying heat to the individual connection members and the wafer (or package, or substrate), the layers 1204 will melt and wet the whole area of contact pad 903b. This reflow process step is shown indicated in FIG. 12 by the bulging perimeter contours of layers 1204.

Figure 13:
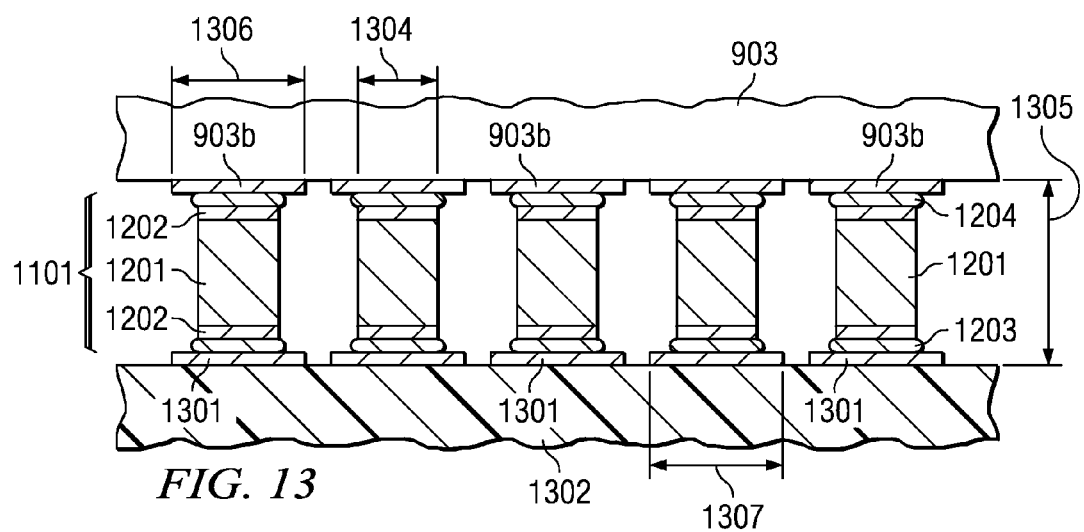
FIG. 13 is a schematic cross section of the interconnections using the composite columns after reflow attachment of the wafer (or package, or substrate) onto an external part.

The schematic cross section of FIG. 13 describes the typical result of a flip-chip surface mount assembly of a chip or package 903 onto the contact pads 1301 of a substrate 1302. The assembly is heated to the reflow temperature of layer 1203 so that the reflowable material of layer 1203 is melting. Under the slight pressure of assembly, layers 1203 deform into the somewhat bulgy perimeter indicated in FIG. 13. In contrast to the solder layers 1203, the non-reflowable columns 1201 of the members remain unchanged by the assembly temperature: cylinders of uniform diameter and uniform height, positioned vertically relative to the plane of the substrate pads 1301.

Referring now to FIG. 7, in a mass-produced device by way of example, the standoff 705 is 180 µm, while bulge 703a has a diameter 704 of 270 µm. In this device, the contact pad 203b (made of copper) of the device has a diameter 706 of 140 µm, the contact pad 701 (made of copper) of the board has a diameter 707 of 175 µm. The board 702 typically has a higher coefficient of thermal expansion than the device 203. Consequently, stress is created at the solder joint during temperature cycling, as it is experienced during reliability testing from −40 to +150° C. or in device operation. For the geometries involved, a calculation of the moment of inertia shows an estimated 260·10E6 µmE4.

This value is to be compared to the same device having the column-shaped members of FIG. 13. The standoff 1305 is 180 µm, while the diameter 1304 of the connection column is 140 µm throughout the length of the column. The contact pad 903b of the device has a diameter 1306 of 140 µm, the contact pad 1301 of the board has a diameter 1307 of 175 µm. The board 1302 typically has a higher coefficient of thermal expansion than the device 903. Consequently, stress is created at the solder joint during temperature cycling, as it is experienced during reliability testing from −40 to +150° C. or in device operation. For the geometries involved, a calculation of the moment of inertia shows an estimated 18.8·10E6 µmE4.

This value is a 13× improvement over the value calculated for the assembly in FIG. 7. For comparable Young's moduli and the same displacement, this improvement translates into a reduced stress by at least a factor of 10.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the concept of punching, on the location of usage, a plurality of non-reflowable interconnections of equal height from a sheet of starting material and then affixing these interconnections in the assembly of one part with another part, can be applied to a wide range of products. These products can especially be found in, but are not limited to, electronics boards composed of a variety of different components. It is therefore intended that the appended claims encompass any such modifications or embodiments.

We claim:

1. A device comprising:
   an integrated circuit chip having a plurality of pads;
   column shaped non-reflowable contact members each having a height-to-diameter ratio and a sidewall marked with stamping marks;
   said members having a solderable top and bottom surfaces on each end and a layer of reflowable material on each end, the reflowable material being selected from a group consisting of tin, tin alloys and conductive adhesive compounds; and
   each of said members solder-attached at one end to a contact pad, the other end of each member operable for reflow attachment to external parts.

2. The device according to claim 1 wherein said height-to-diameter ratio is greater than or equal to 1.

3. The device according to claim 1 wherein said members are made of low modulus material selected from a group consisting of aluminum, copper, nickel, titanium, tantalum, tungsten, and alloys thereof.

4. The device according to claim 1 wherein said solderable end surfaces of said members are provided by an additional layer of metal adherent to said end surfaces of said members.

5. The device according to claim 4 wherein said additional metal is selected from a group consisting of copper, nickel, gold, silver, palladium, and alloys thereof.

6. The device according to claim 1 wherein said reflowable material is selected from a group consisting of tin/copper, tin/indium, tin/silver, tin/bismuth, tin/lead.

7. The device according to claim 1 wherein said reflowable material selected for the member end facing said chip has a higher reflow temperature than the reflowable material selected for the member end intended for attachment to external parts.

8. A device comprising:

an integrated circuit chip having a plurality of pads;

column shaped non-reflowable contact members each having a height-to-diameter ratio and a sidewall marked with stamping marks;

said members having a solderable top and bottom surfaces on each end and a layer of reflowable material on each end, the reflowable material being selected from a group consisting of tin, tin alloys and conductive adhesive compounds; and each of said members solder-attached at one end to a contact pad, the other end of each member operable for reflow attachment to external parts, wherein reflowable material does not substantially cover the sidewalls of the contact members.

9. The device according to claim 8 wherein said height-to-diameter ratio is greater than or equal to 1.

10. The device according to claim 9 wherein said members are made of low modulus material selected from a group consisting of aluminum, copper, nickel, titanium, tantalum, tungsten, and alloys thereof.

11. The device according to claim 10 wherein said solderable end surfaces of said members are provided by an additional layer of metal adherent to said end surfaces of said members.

12. The device according to claim 11 wherein said additional metal is selected from a group consisting of copper, nickel, gold, silver, palladium, and alloys thereof.

13. The device according to claim 9 wherein said reflowable material selected for the member end facing said chip has a higher reflow temperature than the reflowable material selected for the member end intended for attachment to external parts.

* * * * *